(12) United States Patent
Mar (10) Patent No.: US 6,373,344 B1
(45) Date of Patent: Apr. 16, 2002

(54) HIGH PERFORMANCE DUAL-YTO MICROWAVE SYNTHESIZER

(75) Inventor: Wing J. Mar, Rohnert Park, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/733,877

(22) Filed: Dec. 8, 2000

(51) Int. Cl.$^7$ .................................................. H03B 5/18

(52) U.S. Cl. ............................ 331/96; 331/34; 331/175

(58) Field of Search ............................. 331/2, 10, 47, 331/34, 96, 175, 177 R (56) References Cited

U.S. PATENT DOCUMENTS

| | | | |
|---|---|---|---|
| 4,887,052 A | * | 12/1989 | Murakami et al. ............ 331/96 |
| 5,119,035 A | * | 6/1992 | Goy et al. .................. 324/639 |
| 5,200,713 A | * | 4/1993 | Grace et al. .................. 331/49 |

* cited by examiner

Primary Examiner—David Mis (57) ABSTRACT

A microwave synthesizer apparatus features very low phase noise, fine frequency resolution and wide tuning range coverage. The microwave synthesizer apparatus utilizes a fundamental offset source in an offset phase lock loop (PLL) to translate an output signal Fout to a lower IF signal Fif for locking to a low frequency interpolation signal Fint. The use of the fundamental offset source instead of the conventional multiple frequency offset signal from a comb generator or sampler results in superior phase noise and spurious performance. The synthesizer comprises a main signal loop having a main loop VCO that produces an output signal Fout and an offset signal loop having an offset VCO that produces an output signal Fos. The signals Fos and Fout are mixed in the main loop to control the frequency of the signal Fout. The main loop VCO and the offset loop VCO preferably are YIG-tuned Oscillators (YTOs) that share a main coil. Moreover, the main YTO and the offset YTO preferably have a common housing and further, each of the main YTO and the offset YTO has a separate FM coil. The use of a dual YTO in the microwave synthesizer apparatus minimizes overall cost and power consumption of the synthesizer by combining the dual YTO in the single package. In one embodiment, the microwave synthesizer further comprises a mode selection feature that selects between operation of the synthesizer in an offset or dual loop mode and a variable divider or single loop mode. In another embodiment, the microwave synthesizer further comprises a selectable frequency divider that produces the output signal Fos with a smaller frequency step size.

26 Claims, 6 Drawing Sheets

*Prior Art*

HIGH PERFORMANCE DUAL-YTO MICROWAVE SYNTHESIZER

TECHNICAL FIELD

The invention relates to microwave synthesizers. In particular, the invention relates to a microwave synthesizer that has a dual YIG tuned oscillator.

BACKGROUND ART

Signal sources, sometimes referred to as frequency sources, are used to generate signals for use in many electronic systems. Signal sources can be divided into two main types known as the so-called "free-running" or "unlocked" sources and the "locked" or referenced sources. In general, there are two classes of unlocked signal sources: fixed frequency sources and tunable sources. Fixed frequency signal sources operate at a single frequency and can be made very stable, spectrally pure, and accurate by using so called high-Q resonators. High-Q resonator based sources include crystal oscillators, dielectric resonator oscillators, and surface acoustic wave (SAW) oscillators. While fixed frequency, high-Q resonator based sources offer high stability and state-of-the-art frequency accuracy, these high-Q resonator based sources generally produce a single, fixed frequency.

Tunable sources, on the other hand, provide an output that can be varied or tuned over a range of frequencies. The tunable sources are used in applications where the desired frequency is either unknown a priori during the system design or when the desired frequency must be changed or adjustable as a matter of system operation. Tunable sources usually provide continuous or nearly continuous tuning capability across their frequency range of operation. However, tunable sources generally exhibit poor frequency accuracy and frequency stability when compared to high-Q, fixed frequency sources. Therefore, when using unlocked sources for a given system design, a choice must usually be made between high stability, spectral purity, and accuracy on the one hand and frequency tunability on the other hand.

Applications requiring a source with both high-Q frequency stability/accuracy characteristics and frequency tunability generally necessitate the use of a so-called "locked" signal source. In a locked source, a tunable source is locked to or otherwise derived from a fixed or "reference" source. Often the tunable source is locked to a reference source using one or more feedback circuits or feedback loops. In the case of a locked source using a feedback loop, once the feedback loop is closed the tunable source can achieve frequency stability and accuracy that are a function of the reference source frequency stability. Such a configuration of tunable and fixed sources locked together is known in the art as a synthesized source or simply as a frequency synthesizer.

A frequency synthesizer, then, is a signal source that generates an output signal from one or more reference signals. In general, frequency synthesizers produce a signal consisting of a single frequency selected from among a finite set of discrete frequencies available by virtue of the design of the synthesizer. Frequency synthesizers of various forms and designs have been found to be highly useful if not essential in a wide variety of applications including FM car radios, sophisticated radar systems, and test equipment such as spectrum analyzers and signal generators.

In many cases, the synthesized signal produced by a given synthesizer is often at a higher frequency than that of the reference signal(s). The synthesized signal is typically a very stable, spectrally pure, single frequency signal having low or sometimes even very low phase noise. However, unlike other signal sources, such as a free-running voltage controlled oscillator (VCO), a given frequency synthesizer generally is capable of producing only a finite, although often large, number of selectable, discrete frequencies as an output signal. Therefore, frequency synthesizers are most often used where the frequency stability/precision and spectral purity are of paramount importance. Hereinbelow, frequency synthesizers will be referred to as variable frequency sources to distinguish them from the tunable, free-running sources that generally have a continuous tuning range.

A number of different types of frequency synthesizers or methods of frequency synthesis are known in the art including direct frequency generation, direct digital synthesis (DDS), and phase locked loop (PLL) frequency synthesis. The direct frequency generation synthesizer, while not strictly speaking considered a locked source, typically utilizes a combination of frequency multiplication, division, and addition to generate a desired frequency from one or more reference frequencies. Frequency multiplication is accomplished using a non-linear device, such as a step recovery diode or comb generator, to produce a large number frequency harmonics of a reference signal source frequency. Frequency division is typically accomplished using a digital frequency divider. Addition or subtraction of frequencies is implemented using a mixer, which ideally accepts two input signals and produces two output signals, one output signal at the frequency that is the sum of the two input signal frequencies and the other output signal at a frequency that is the difference of the two input signal frequencies. The combination of multiplication, addition, subtraction and division allows the direct frequency generation synthesizer to produce a finite number of output signal frequencies.

The DDS uses a digital to analog converter (DAC) to convert a digital data stream into an analog output signal. The digital data stream is a digital representation of a sampled version of the desired output signal, thus the DDS directly synthesizes the output signal. In a PLL synthesizer, a negative feedback loop is used to compare and "phase lock" the output signal of a tunable frequency source, such as a VCO, to a stable reference signal produced by one or more reference sources. When locked, the PLL output frequency is typically a multiple of the reference signal or linear combination of the reference signal and other signals generated by the synthesizer. There are also hybrid synthesizers that combine one or more of these or other various frequency synthesis approaches.

As is the case with frequency synthesizers in general, there are also many ways to realize a PLL synthesizer. In some applications, a simple single loop approach is acceptable or even preferred. In other instances, more complicated, multiple loop approaches are required. Generally, for high-performance applications, such as a local oscillator LO of a high-performance spectrum analyzer, the microwave synthesizer invariably involves multiple loops to optimize phase noise, spurious performance, sweep rate, and locking speed.

Figure 1:
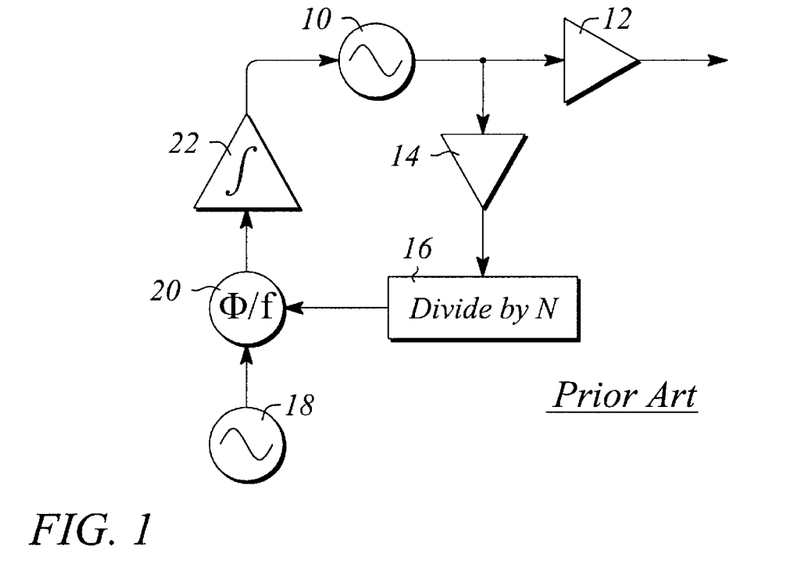
FIG. 1 illustrates a block diagram of a basic, single loop, phase locked loop based frequency synthesizer of the prior art.

FIG. 1 illustrates a block diagram of a basic, single loop PLL synthesizer (SLS) used to synthesize a signal from a stable reference. The basic SLS comprises a voltage-controlled oscillator (VCO) 10, a loop frequency divider 16, a reference oscillator 18, a phase/frequency comparator or detector (PFD) 20, and a loop integrator 22. The VCO 10 produces an output signal, the frequency of which is proportional to an input control voltage. The frequency divider 16 to create a lower frequency signal divides the output signal produced by the VCO 10. The frequency divider 16 is an apparatus that accepts a signal at a frequency f and produces an output signal at a frequency f/N where N is the division factor of the frequency divider.

The signal produced by the frequency divider 16 is compared by the PFD 20 to a reference frequency signal produced by the reference oscillator 18. The PFD 20, in turn, produces an error voltage signal that is proportional to the phase/frequency difference between the frequency of the output signal of the frequency divider 16 and the reference signal frequency fref. The error voltage is integrated by the loop integrator 22 to produce the input control voltage of the VCO 10.

In some implementations, an output amplifier 12 and a loop amplifier 14 are included in the basic SLS. The output amplifier 12 is used to amplify the output signal produced by the SLS. The loop amplifier 14 is used to amplify the portion of the output signal that is used by the frequency divider 16. The loop amplifier 14 also provides reverse isolation between the frequency divider 16 and the SLS output.

The action of the negative feedback loop of the PLL eventually causes or forces the error voltage to equal zero, a situation that is strictly true only when the output from frequency divider 16 has the same phase as the reference signal fref In essence, the VCO 10 output signal is automatically adjusted by the feedback loop until the phase of the divided signal produced by the frequency divider 16 equals the phase of the reference signal. Moreover, since the frequency of a signal is the derivative of the phase of the signal, for a pair of signals to have the same phase the signals must also have the same frequency. When the error voltage has been made equal to zero by the action of the feedback loop, the loop is said to be "locked" to the reference source. When locked, the loop maintains the following frequency relationship:

$$f=N*fref \quad (1)$$

Changing either the division factor N of the loop divider 16 or the reference signal frequency can be used to change the frequency f of the output signal. Generally but not always, the reference signal is fixed and the loop division factor is changed to affect tuning in a single loop frequency synthesizer (SLS).

The basic SLS has a major performance limitation when used to synthesize microwave frequencies in that the loop division factor N of the loop divider 16 is typically large. For example, if the frequency fref of the reference signal equals 5 MHz, N must be equal to 1000 in order to synthesize an output signal with a frequency f of 5000 MHz. Moreover, since by equation (1) the frequency f of the output signal equals N*fref when the loop is locked, one hertz of frequency noise at fref will produce N Hertz of frequency noise at the output signal frequency f A measure of phase noise that is added to the output signal from the reference source by the operation of a synthesizer is referred to as the noise gain or Gnoise of the synthesizer. In the SLS of FIG. 1, Gnoise is given in dB by $$Gnoise=20*log(N) \text{ dB} \quad (2)$$

where log(·) is the logarithm, base ten of the argument. Again, by way of example, if the combined phase noise floor of the phase detector 20, the loop integrator 22, the loop divider 16, and the reference source 18 of the SLS is −150 dBc/Hz and N equals 1000, then the noise gain Gnoise is equal to 60 dB and the phase noise pedestal, which is the flat region of the phase noise inside the loop bandwidth, of the output signal would be at least −90 dBc/Hz.

Since low phase noise in the output signal is often a key performance characteristic of a synthesizer, it is important to consider approaches that minimize the phase noise. A microwave synthesizer, with its very high frequency operation and wide tuning range, typically requires special efforts to achieve good phase noise performance. Given that the phase noise in the single loop synthesizer is directly related to N, a seemingly obvious way to improve the phase noise is to reduce the division factor N. This can sometimes be accomplished in a satisfactory manner by increasing the reference signal frequency fref.

However, while it is always possible to increase the frequency fref to reduce N, there are limitations to this approach in terms of the practical reduction of phase noise. In particular, unless a fractional-N loop divider 16 (i.e. N not an integer) is used, the reference signal frequency fref entirely determines the spacing between adjacent frequencies f that can be synthesized. The spacing between adjacent frequencies f is often referred to as the "step size" or frequency resolution of the synthesizer. For example, if fref is 10 MHz and N is an integer, the minimum step size of the synthesizer is 10 MHz. While fractional-N dividers can be used to lessen the step size limitations of using higher reference frequencies, the current state-of-the-art in frequency divider technology limits fref of a fractional-N based PLL to about 50 MHz. In practice, a maximum fref limit of 10 MHz or below is more commonly employed with state-of-the-art, fractional-N dividers to minimize spurious problems associated with the dividers 16.

Moreover, even if step size is not a constraining factor, in general, the higher the possible frequency range of a given reference oscillator or reference source 18 technology, the higher the inherent phase noise produced by that oscillator 18 becomes. To put it another way, a high frequency, free-running, reference signal source generally has poorer phase noise performance than an equivalent low frequency free-running source due to the difficulty of obtaining resonators with sufficiently high-Q at high frequencies. Furthermore, the loop divider N operating at the higher frequency fref also produces higher noise. Therefore, increasing the frequency fref is usually not a practical approach for significantly reducing N and the phase noise gain associated therewith.

Figure 2:
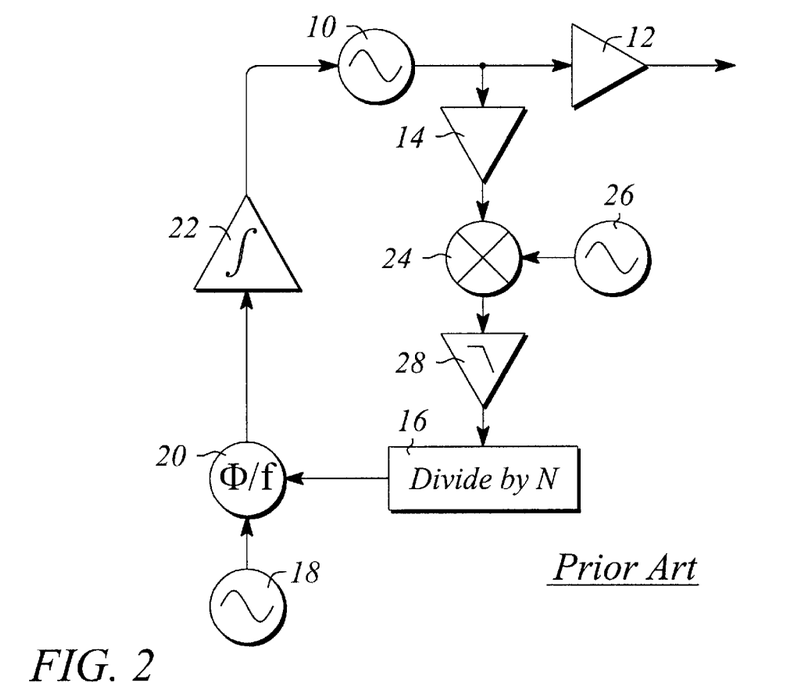
FIG. 2 illustrates a block diagram of a phase locked loop synthesizer of the prior art that utilizes an offset loop.

A more commonly employed technique to reduce N is to use a so-called offset loop synthesizer. FIG. 2 illustrates a block diagram of a basic offset loop frequency synthesizer (OLS). The OLS uses a low-noise, high frequency offset signal to downconvert or frequency shift the output signal of a main loop to a lower frequency prior to dividing the signal frequency in the main loop divider. The OLS comprises a VCO 10, an offset mixer 24, an offset signal source 26, a loop frequency divider 16, a PFD 20, a reference source 18, and a loop integrator 22.

The output signal of the VCO 10 at a frequency f is mixed with an offset signal at a frequency fos. Generally, the offset signal frequency fos is chosen to be close to the output signal frequency f. The offset mixer 24, in turn, ideally produces output signals with the sum and the difference of the two input frequencies. The difference frequency is used to produce an intermediate frequency (IF) signal at a frequency fif where the value of the frequency fif is given by:

$$|fif|=|f-fos| \quad (3)$$

The difference signal is selected by using a lowpass filter 28 and becomes the filtered IF signal. The filtered IF signal is then divided by the loop frequency divider 16 and compared to the reference signal from the reference source 18 by the PFD 20 to produce an error voltage that is integrated by the loop integrator 22 to produce the VCO 10 control voltage. Typically, an output amplifier 12 and a loop amplifier 14 are used in the OLS, as mentioned above for the SLS.

When the loop is locked, the output signal frequency is equal to (fos−N*fref) or (fos+N*Fref), depending the polarity of the loop. Since the IF signal is at a frequency fif that is typically much lower than the VCO 10 output signal frequency f, the division factor N required for a given reference signal frequency fref is typically much smaller than would be required for the SLS described hereinabove with respect to FIG. 1. Therefore, the phase noise gain Gnoise associated with the loop division factor N is significantly reduced using an offset loop as in the OLS.

For example, consider the synthesis of an output signal at f=5000 MHz from a reference signal of fref=5 MHz using an offset signal frequency fos equal to either at 4995 MHz or 5005 MHz. In this example N is set equal to 1, resulting in a Gnoise=0 dB. Comparing this result to the single loop, SLS example hereinabove where N=1000, it is readily apparent that the offset loop synthesizer (OLS) has up to 60 dB less Gnoise than the single loop synthesizer (SLS).

The difficulty encountered with using an offset loop synthesizer (OLS) approach to meet low phase noise specifications involves the problem of producing a low phase noise offset signal at approximately the same frequency as the output signal. Advantageously, however, the offset signal generally does not need to have as fine a frequency resolution as that of the OLS output signal, although it typically needs to have the same frequency range as the output signal. In fact, in some applications where the output frequency range is limited, a fixed frequency offset signal will suffice. Even when several offset signal frequencies are desired, the opportunity exists to use a much coarser resolution for the offset signal. This fact opens up the possibility of using a second phase locked loop for generating the offset signal and employing a higher frequency reference signal for this loop.

A side benefit of using an offset loop approach based on a PLL loop synthesized offset signal is that the overall tuning range of the synthesizer can be extended by changing the division factors and/or reference signal frequency fref used in both the main loop and the offset loop. For example, the offset loop can provide the synthesizer with large or course frequency steps while the main loop provides the fine frequency resolution.

Figure 3:
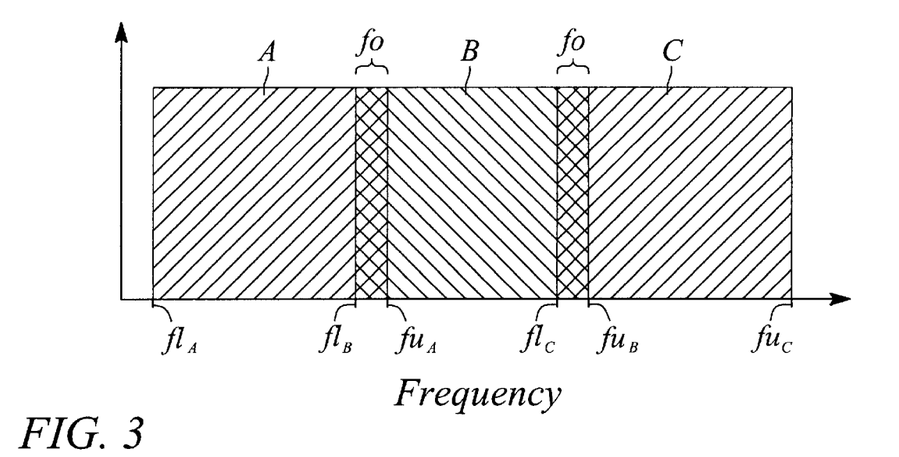
FIG. 3 illustrates an example frequency tuning plan for an offset PLL synthesizer of FIG. 2 having both coarse and fine tuning.

This range extension concept is illustrated in FIG. 3 as a frequency plot showing, for example, three bands labeled A, B, and C. Each step of the offset loop course tuning range sets or selects the operational range of the synthesizer to be in one of the bands, A, B, or C. Once the operational band has been set, the synthesizer then tunes across the selected operational band, for example band B, using the fine frequency steps of the main loop. The fine-tuning frequency steps of the main loop provide tuning from a lower end of the selected band at frequency $fl_B$ to an upper end of the band at frequency $fu_B$. Each band has a corresponding lower and upper band edge. For example, band A has a lower band edge at frequency $fl_A$ and an upper band edge at $fu_A$.

Extremely broad tuning ranges with very fine frequency resolution are possible with this approach. The caveat is that the span or tuning range covered by the IF signal must be wide enough to cover the "gaps" or frequency range between the coarse frequency steps. In practice the main loop is designed to have a range that overlaps or is greater than the spacing between the coarse frequency steps. Referring to the example of FIG. 3, this overlap is indicated by the region of the frequency bands labeled "fo".

Figure 4:
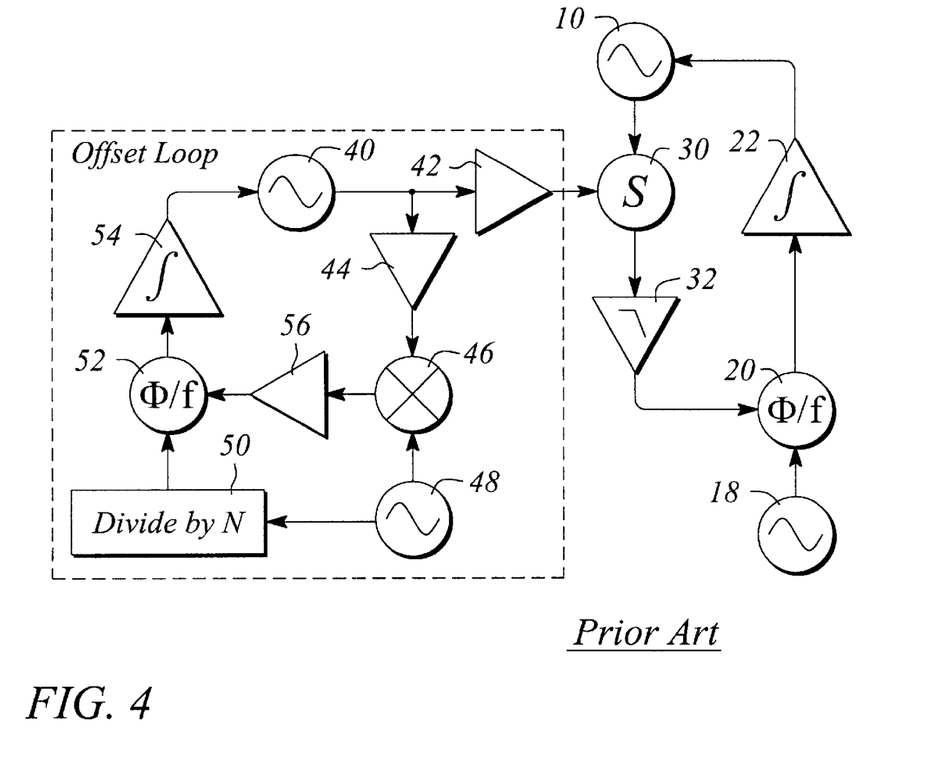
FIG. 4 illustrates a block diagram of an offset loop sampling oscillator driving a sampler of the prior art.

When using two PLLs, one as the main loop and one in the offset signal loop, it is often important to consider the added cost of the offset PLL. A conventional low cost technique to produce the offset signal via a PLL is to use a sampler 30 driven by a low frequency sampling signal. FIG. 4 illustrates a block diagram of such an implementation of a dual loop synthesizer (DLS) comprising the main loop and an offset loop.

Typical microwave samplers 30 comprise a pair of sampling diodes and use a step recovery diode driven by a sampling source to produce fast pulses that momentarily turn on the pair of sampling diodes at the sample frequency fs. When the sampling diodes turn 'on', they sample the VCO 10 output signal. The effect of this sampling is to produce a multitude of signals at the output of the sampler 30 that are the sum and the difference of the harmonics of the frequencies f and fs, (i.e. |J*fs+/−K*f|). The sampler 30 as employed in the sampling offset loop synthesizer illustrated in FIG. 4 thus behaves as a harmonic mixer. Only one of the mixing products from the sampler 30, typically |f−H*fs| is selected as the sampler IF signal for locking purposes.

It should be noted that the low frequency sampling signal must have exceptionally low phase noise to produce a low phase noise, synthesized output signal. This is because the phase noise of the signal produced by the sampling offset loop approach is the power sum of the phase noise of the VCO output signal and the phase noise of the sampling signal multiplied by the harmonic number H.

In addition, in sampler based synthesizers so-called crossing spurs may be a problem. In a synthesizer in which sampler IF signals cover a wide range of frequencies, $n^{th}$ order mixing products may fall inside the same frequency range as that of the sampler IF signal. These mixing products are generally unwanted and therefore spurious signals. Spurious signals resulting from $n^{th}$ order mixing products tend to move in frequency as the synthesizer is tuned, at a rate that is n times that of the desired, $1^{st}$ order product. These spurs tend to cross the desired operational band, and are therefore referred to as crossing spurs. Unfortunately, since these $n^{th}$ order mixing products share the frequency range with that of the sampler IF signal, they cannot be filtered out using a filter.

While crossing spurs cannot be eliminated, the detrimental effect of crossing spurs can be reduced by decreasing the sampler IF signal frequency range. The narrower the frequency range of the sampler IF signal, the higher will be the order of the spurs that will cross the operational band of the sampler IF signal. Advantageously, the higher the order of a spur, the lower the amplitude of the spur and therefore, the less detrimental it is in terms of synthesizer performance.

Unfortunately, reducing the frequency range of the sampler IF signal for a given synthesizer design requires a larger selection of sample frequencies fs to minimize the sample frequency fs gaps. The frequency range of the sample frequency fs is generally determined by the minimum output frequency and the minimum sample frequency fs used. The maximum frequency gap that the sampler IF signal must cover is determined by the step size of sample frequency fs and the highest harmonic of the sample frequency fs being utilized. So there may be severe practical limitations on how narrow the sampler IF can be made in a given design.

Consequently, there are a number of conflicting requirements for the sampler-based PLL synthesizer. Compromises are often made to balance the requirements of the sample frequency fs and sampler IF signal range. The sampler 30 output or sampler IF signal frequency range needs to be as small as possible to help to reduce the effect of crossing spurs and to simplify the requirements of the tuning reference or interpolation signal of the main loop. However, the frequency range of the sampler IF signal needs to be as large as possible to allow for a coarse stepped sample frequency fs. The coarser the frequency steps, the easier and less expensive it is to implement the sampling signal. The sampling signal should have a high frequency sampling signal frequency fs to minimize the harmonic number H. However, a small H requires the sample frequency fs to have a wider frequency range, making low phase noise more difficult to achieve. Moreover, the power level of the signal entering the sampler 30 should be as high as is practical to produce the strongest sampler output signal and maximize the signal-to-noise ratio (SNR) of that signal. Maximizing the sampler 30 output SNR helps to minimize the phase noise of the sampler. On the other hand, the signal level into the sampler 30 should be as low as possible to minimize the generation of higher harmonics and thus to minimize power level of the crossing spurs.

Slightly better performance can be achieved by using a comb generator and an offset mixer in place of the sampler 30. The comb generator is usually a step recovery diode driven hard by the sampling signal to produce a strong comb signal with good signal-to-noise ratio. The comb generator output is used as an RF input into the offset mixer with the VCO output signal acting as an LO input. It is known in the art that using a high-level mixer as the offset mixer with strong LO drive produces an IF signal with minimum spurs. In addition, a filter can be inserted between the comb generator and the offset mixer to further improve spur performance. The comb generator and offset mixer can achieve much lower phase noise than a sampler. However, the dominant phase noise contributor in the offset PLL synthesizer is the phase noise pedestal of the offset signal as noted hereinabove. Therefore, the phase noise improvements that may be gained from the use of the comb generator and offset mixer are likely to be modest. It is also possible to achieve minor improvements in the offset signal phase noise pedestal by using multiple dividers. For example, using two ECL phase detectors and two ECL dividers in parallel can reduce the phase noise due to these components by about 3 dB. Even with these minor improvements, it is difficult to achieve a phase noise pedestal of –125 dBc/Hz for a conventional tunable offset PLL based microwave synthesizer.

Accordingly, it would be advantageous to have a microwave synthesizer apparatus that achieved a wide tuning range, small step size and low phase noise. In addition, it would be desirable to minimize the DC power requirements and the overall factory cost. In the case of a local oscillator for a spectrum analyzer, the LO synthesizer must be sweepable or variable in narrow spans and preferably in wide spans as well. Such a microwave synthesizer apparatus would solve a long-standing need in the area of microwave signal synthesis.

SUMMARY OF THE INVENTION

The present invention provides a novel dual Yttrium-Iron-Garnet (YIG) tuned oscillator (YTO) microwave synthesizer apparatus. The dual YTO microwave synthesizer features very low phase noise, fine frequency resolution and wide tuning range coverage. The microwave synthesizer of the present invention utilizes a single frequency offset signal source in an offset phase lock loop (PLL) to translate the output signal Fout to a lower IF signal Fif for locking to a low frequency interpolation signal Fint. The use of the single fundamental offset source instead of the conventional multiple harmonic offset signal from a comb generator or sampler results in superior phase noise and spurious performance. Furthermore, the use of a dual YTO by the synthesizer of the present invention minimizes overall cost and power consumption of the synthesizer by combining the dual YTO, comprising a main YTO and an offset YTO, in a single package.

In one aspect of the present invention, the dual YTO microwave synthesizer comprises a main PLL and an offset PLL. The offset PLL produces a single frequency offset signal Fos that is used to offset or downconvert a synthesizer output signal Fout. The offset signal Fos eliminates the need for a loop divider in the main loop and the related phase noise degradation associated therewith. Moreover, the use of the single frequency offset signal Fos eliminates low-order crossing spurs in the output signal Fout of the microwave synthesizer. Furthermore, the tunable high-frequency sampling PLL that is a major phase noise contributor in conventional offset PLL-based microwave synthesizers is replaced with a fixed frequency sampling signal Fs, which can be built as a crystal oscillator with very low phase noise. The power consumption of this fixed frequency Fs can be significantly lower than the tunable sampling PLL using ECL devices, which generally require much higher power. By combining the offset YTO in the same package of the main YTO so that only one main coil is used, no additional main coil power is required. The power requirement and cost for this dual YTO would only be slightly more than that of a single YTO. Thus, the cost and power consumption of the dual YTO microwave synthesizer of the present invention can be reduced compared to conventional synthesizers while achieving significant performance improvements.

In another aspect of the invention, the dual YTO microwave synthesizer is provided with a mode selection feature. The mode selection feature selects between operating the main loop in an offset or dual loop mode and a variable divider or single loop mode. The offset mode provides low phase noise while the divider mode provides faster tuning speed and wider tuning range.

In yet another aspect of the present invention, the dual YTO microwave synthesizer is provided having an offset signal with a smaller step size by using a selectable frequency divider. The selectable frequency divider utilizes the fixed frequency, sampling signal Fs. The sampling signal Fs provides sampling of the offset signal Fos as well as being divided and mixed to produce a selectable reference signal to which the sampled offset signal is phase locked.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which.

MODES FOR CARRYING OUT THE INVENTION

The present invention is a novel microwave synthesizer having a dual YIG-tuned oscillator (YTO) microwave offset phase locked loop (PLL) architecture. Moreover, the dual YTO offset PLL architecture of the present invention incorporates a single-tone, offset signal Fos produced by an offset PLL loop.

Figure 5:
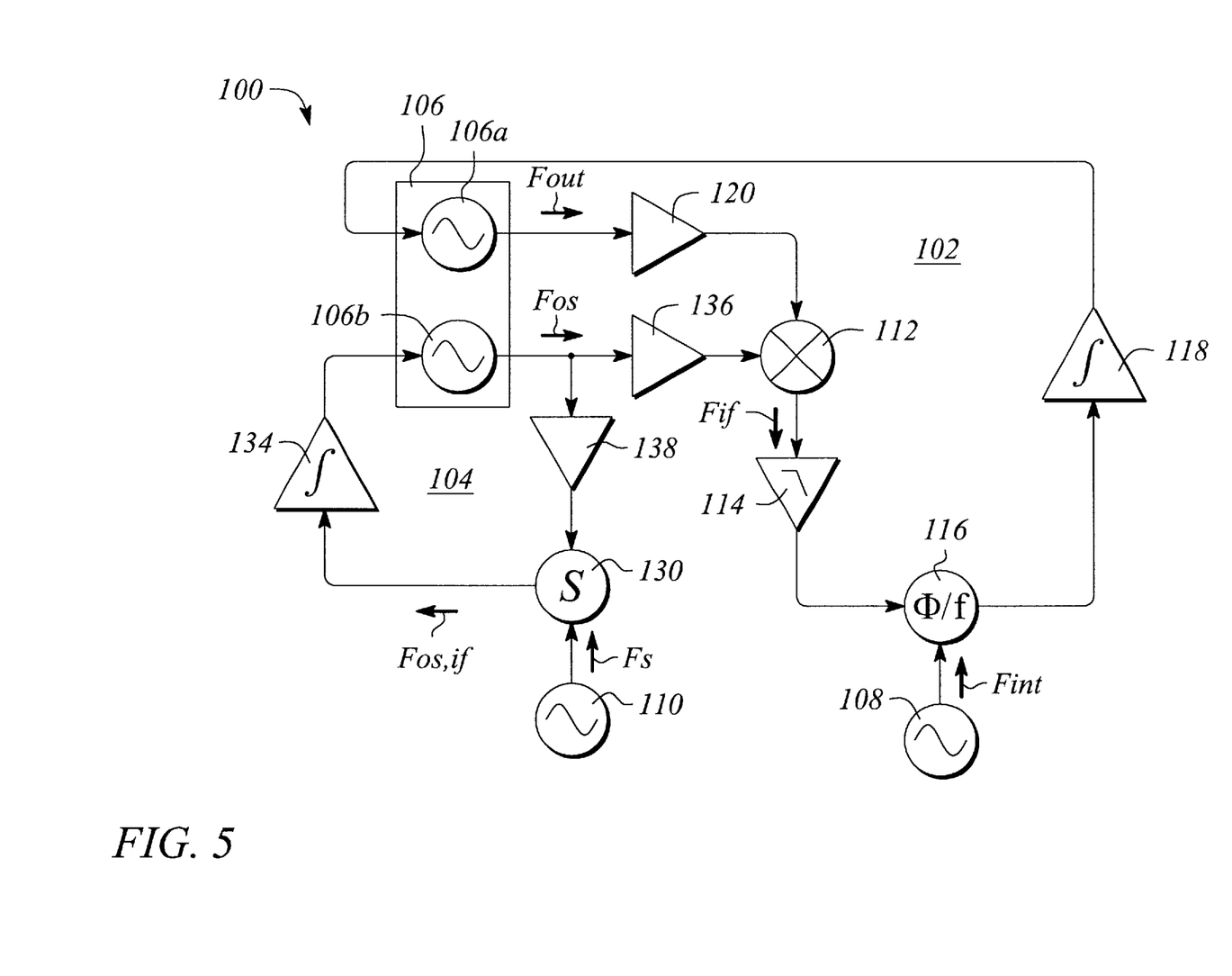
FIG. 5 illustrates a block diagram of a dual YTO microwave offset PLL synthesizer with single frequency offset signal of the present invention.

FIG. 5 illustrates a block diagram of the dual YTO microwave offset PLL synthesizer 100 of the present invention. The microwave synthesizer 100 comprises a main loop 102 and a frequency offset loop 104. The main loop 102 produces an output signal Fout. The output signal Fout, frequency translated by an offset signal Fos, is phase locked to a tunable interpolation signal Fint produced by an interpolation signal source 108. The offset loop 104 produces the offset signal Fos. The offset signal Fos is phase locked to a reference or sampling signal Fs generated by a reference oscillator 110. The offset signal Fos is a single frequency or single tone offset signal and is used to convert the output signal Fout to a lower intermediate frequency Fif that is the difference of output signal Fout and the offset signal Fos.

The microwave synthesizer 100 of the present invention comprises a pair of voltage-controlled oscillators (VCOs) 106, a first one of which is called a main VCO 106a and a second one of which is called an offset VCO 106b. The main VCO 106a is part of the main loop 102 while the offset VCO 106b is part of the offset loop 104. A number of different classes of VCOs can be used for the main VCO 106a and the offset VCO 106b including but not limited to varactor-tuned oscillators, Gunn-diode oscillators, voltage controlled crystal oscillators and Yttrium-Iron-Garnet (YIG) tuned oscillators. One skilled in the art would readily understand the applicability of the various classes of VCOs to the present invention.

Preferably, the main VCO 106a is a YIG-tuned oscillator (YTO) due to the inherently low phase noise associated with this class of VCOs. Also, preferably the offset VCO 106b is either a varactor-tuned oscillator or more preferably a YIG-tuned oscillator (YTO). More preferably, the main YTO 106a and offset YTO 106b are housed together as a pair in a single package or housing. The pair of the main YTO 106a and offset YTO 106b is referred to herein as a dual YTO 106. The main YTO 106a and the offset YTO 106b of the dual YTO 106 share a single main coil but each have a separate, independent fine-tune, or FM coil. The FM coils of the main YTO 106a and the offset YTO 106b control the frequencies of the signals produced by the YTOs 106a, 106b. The signal Fout is an output signal produced by the main YTO 106a and the signal Fos is a signal produced by the offset YTO 106b.

The main loop 102 comprises the main YTO 106a, the interpolation signal source 108, an optional main loop amplifier 120, a main loop or offset mixer 112, a main loop filter 114, a phase/frequency detector (PFD) 116, and a main loop integrator 118. An output port of the main YTO 106a is connected to an input port of the optional main loop amplifier 120, or directly to the main loop mixer 112. An output port of the optional amplifier 120 is connected to a first input port of the main loop mixer 112. Normally, the first input port of the mixer 112 is a radio frequency (RF) port. An output port of the mixer 112 is connected to an input port of the main loop filter 114. The output port of the mixer 112 is normally the intermediate frequency (IF) port. An output port of the filter 114 is connected to a first input port of the PFD 116. A second input port of the PFD 116 is connected to an output port of the interpolation signal source 108. An output port of the PFD 116 is connected to an input port of the main loop integrator 118, an output port of which is connected to the FM coil of the main YTO 106a, thereby closing or completing the main loop 102.

In another embodiment, the optional main loop amplifier 120 may be unnecessary and, therefore omitted. In yet another embodiment, the main loop amplifier 120 may be incorporated in either the YTO 106a or in the RF port of the mixer 112. One skilled in the art would readily be able to determine whether and where to incorporate the amplifier 120 in the main loop 102 without undue experimentation.

The offset loop 104 comprises the offset YTO 106b, the reference oscillator 110, an optional offset loop output amplifier 136, an optional offset loop amplifier 138, a sampler 130, and an offset loop integrator 134. An output port of the offset YTO 106b is connected to input ports of the optional offset loop output amplifier 136 and the offset loop amplifier 138, or directly to the main loop mixer 112 and sampler 130, respectively. An output port of the optional offset loop amplifier 138 is connected to a first input port of the sampler 130, a second input port of which is connected to an output of the reference oscillator 110. An output port of the sampler 130 is connected to an input port of the offset loop integrator 134. An output port of the integrator 134 is connected to the FM coil of the offset YTO 106b, thereby closing or completing the offset loop 104. An output of the optional offset loop output amplifier 136 is connected to a second input port of the mixer 112 in the main loop 102, to supply the offset signal Fos to the mixer 112. The second input port of the mixer 112 is normally a LO port.

In another embodiment, the optional offset loop output amplifier 136 may be unnecessary and, therefore omitted. In yet another embodiment, the amplifier 136 may be incorporated in either the YTO 106b or in the second (LO) port of the mixer 112. In still another embodiment, the optional offset loop amplifier 138 either may be unnecessary or incorporated in the sampler 130. Having the optional amplifier 136 present in the offset loop 104 is preferable since it provides isolation of signals that may leak from the IF port of the mixer 112. One skilled in the art would readily be able to determine whether and where to incorporate optional amplifiers 136, 138 without undue experimentation.

In operation of the microwave synthesizer 100 of the present invention, the main loop YTO 106a produces the signal Fout and the offset loop YTO 106b produces the signal Fos. The signal Fout is then mixed with the offset signal Fos in the mixer 112 to produce the IF signal Fif. The main loop filter 114 filters the signal Fif. Preferably, the main loop filter 114 is a lowpass filter that selects a lower sideband mixing product. The signal Fif having been filtered is compared with the interpolation signal Fint produced by the interpolation source 108 using the PFD 116. The PFD 116 produces an error signal that is proportional to the difference between the phase of the interpolation signal Fint and the phase of the filtered IF signal. The signal produced by the PFD 108 is then integrated by the main loop integrator 118 to produce a VCO control signal. The VCO control signal then drives the FM coil of the main loop YTO 106a. The action of the main loop 102 is to lock the signal Fout to the interpolation signal Fint produced by the interpolation signal source 108.

In a preferred embodiment of the microwave synthesizer 100, the interpolation signal Fint is a low phase noise, tunable reference signal generated by the interpolation signal source 108. More preferably, the interpolation signal Fint is generated by a DDS or a Fractional-N PLL. One skilled in the art would readily recognize that there are other means of generating a suitable interpolation signal Fint. All such means are considered to be within the scope of the present invention.

Concomitant with the production of the signal Fout by the main loop YTO 106a, the offset YTO 106b of the offset loop 104 produces the signal Fos. In addition to being applied to the main loop mixer 112 to downconvert Fout, the signal Fos is sampled by the sampler 130 at a sample rate fs determined by the reference signal Fs generated by the reference oscillator 110. The sampler 130 operates as a phase comparator or harmonic mixer and downconverts or samples the signal Fos to a lower frequency signal Fos,if, nominally at zero frequency or DC. The signal Fos,if in this case is proportional to the phase difference between the signal Fos and a harmonic H of the sample rate fs. The signal Fos,if functions as a loop error signal that, when integrated by the integrator 134, produces a control signal that is applied to the FM coil of the offset loop VCO 106b. The action of the offset loop 104 is to lock the signal Fos to a harmonic H of the reference signal Fs produced by the reference signal source 110.

As described hereinabove, the microwave synthesizer 100 of the present invention utilizes the offset YTO 106b to produce a single frequency signal as the offset signal Fos. In the preferred embodiment, the offset loop 104 PLL that produces Fos is implemented with the sampler 130 where the reference oscillator 110 produces the sampling signal Fs. Advantageously in the preferred embodiment, the reference oscillator 110 is a fixed frequency crystal oscillator. As noted herein above, the result of the offset loop 104 operation is to lock the signal Fos to a harmonic H of the signal Fs. Unlike the conventional sampling PLLs, the signal Fos is generated as a single frequency centered at frequency fos=H*fs according to the present invention. Advantageously, there is no restriction on the maximum frequency of the signal Fif having to be less than a frequency fs/2. This is because there is no frequency at (H±1)*fs of the signal Fos that can act to produce crossing spurs from the mixer 112.

The fact that the frequency range of the signal Fif can extend beyond fs/2 allows the sampling signal Fs to be a fixed frequency signal and still achieve full continuous coverage of the operational range of the signal Fout. For example, if the signal Fs has a frequency fs equal to 100 MHz and the reference oscillator 110 is a crystal oscillator, then the signal Fos can be chosen to have a frequency fos that is any multiple of 100 MHz within the range of the signal Fout. Furthermore in the present example, if the signal Fif is chosen to have a frequency range of 45 MHz to 105 MHz, then full coverage of the frequency range of the signal Fout can be achieved with 10 MHz of overlap between adjacent selections of steps of the signal Fos.

Assume, for example, that the offset signal Fos is centered at 4000 MHz. Such a signal can be used to synthesize Fout signals in the range of 3895 MHz to 3955 MHz using low side mixing and Fout signals of 4045 MHz to 4105 MHz using high side mixing. Moreover, for this example, using a next available harmonic H produces an offset signal Fos at 4100 MHz. In turn, this offset signal Fos can be used to synthesize Fout signals in the range of 3995 to 4055 MHz and 4145 to 4205 MHz. The choice of which harmonic H is used is automatically determined by how the YTO 106b is pre-tuned.

Advantageously, using a fixed frequency signal Fs allows a high-Q crystal oscillator or voltage controlled crystal oscillator (VCXO) to be used as the reference oscillator 110. The use of such a crystal oscillator enables the production of a signal Fos by the offset loop 104 that has an extremely low phase noise. This, in turn, allows the use of a relatively low frequency fs, thus minimizing the frequency range of Fif. Even though a relatively high value of the harmonic H may be required, it is still possible to produce a signal Fos with excellent phase noise by virtue of the extremely low phase noise of available VCXOs.

For example, VCXOs based on SC-cut crystals are currently commercially available with a phase noise floor of below −176 dBc/Hz at frequencies up to about 100 MHz. If a VCXO with a 100 MHz output signal is used with the present invention and if the VCXO has only a reasonably good noise floor of −170 dBc/Hz, the harmonic number H required to phase lock this VCXO generated signal at a frequency fos=5000 MHz is H=50. The phase noise gain Gnoise due to this multiplication factor according to equation (1) is 34 dB. However, due to the low initial phase noise of the VCXO, the multiplied phase noise at 5000 MHz can still be as good as −136 dBc/Hz.

It should be noted that, in some cases where ultra low phase noise VCXOs are employed, the sampler 130 might become a major phase noise contributor, thus limiting the ultimate phase noise of the offset signal Fos. Fortunately, if the phase noise of the sampler 130 becomes a problem, it is possible to improve the noise performance of the sampler 130 by over driving the sampler. A sampler is over driven by using an input signal (in this case, Fos) having a larger than conventional signal power level. Overdriving the sampler 130 is useful with the microwave synthesizer 100 of the present invention since there are no crossing spurs. If still lower phase noise performance is desired, a comb generator and mixer combination can be used to replace the sampler 130. Advantageously, since the sampling signal Fs of the present invention is a single frequency, the input matching of the comb generator is greatly simplified and makes the comb generator more efficient than in the case where Fs has to tune over a wide range.

Moreover, by using a fixed frequency sampling signal Fs as in the microwave synthesizer 100 of the present invention, the maximum frequency of the IF signal Fif is equal to fs+fo/2, where fo is the overlap in frequency between adjacent steps of the offset signal Fos. Also, the minimum frequency of the IF signal Fif is equal to fs/2−fo/2, and the total range of Fif is fs/2+fo. This range of Fif stays the same for each Fos frequency step, unlike the case with a sampler/comb generator based Fos where each Fos step can require a different range of Fif Returning to the above-described example with a sampling frequency Fs having a frequency fs=100 MHz and where the overlap frequency range fo=10 MHz, the IF signal Fif will have a frequency range from 45 MHz to 105 MHz. Given this range of frequencies for the signal Fif, the interpolation signal Fint that is appropriate advantageously can be synthesized using either direct digital synthesis (DDS) or a fractional-N PLL as the interpolation source 108.

Current technology is such that the spurious performance of DDS at this frequency range of about −65 dBc is not generally acceptable for many state-of-the-art applications, but may work for some. The phase noise pedestal of the fractional-N PLL of about −125 dBc/Hz is marginal, but acceptable for most applications. The phase noise of the fractional-N PLL cited hereinabove is based on the typical value of−105 dBc/Hz at an output frequency of 1000 MHz divided down to 100 MHz.

It should be pointed out that if the frequency range of the signal Fif is reduced, the interpolation signal Fint will be easier to produce. However, while frequency of the sampling signal Fs can be reduced to reduce the frequency of the signal Fif this frequency reduction will result in an increase in the required harmonic H and thus, the phase noise pedestal of the offset signal Fos. So there is a limit on how much reduction of the frequency fs can be tolerated in a given application.

In another preferred embodiment, the microwave synthesizer 100 of the present invention further comprises a pre-tune digital-to-analog converter (DAC) 160 (not illustrated in FIG. 5). The pre-tune DAC 160 is used to pre-tune the offset YTO 106b close to the desired signal Fos frequency of H*fs. The offset loop 104 then automatically adjusts YTO 106b such that its output Fos becomes H*fs. The main YTO 106a is pre-tuned automatically close to H*fs since it shares the same main coil with the offset YTO 106b. The main loop 102 then adjusts the operational frequency of the main YTO 106a to lock to the interpolation signal Fint having a frequency fint so that the output frequency fout is H*fs+fint or H*fs −fint, depending on the mixing sideband chosen. One skilled in the art may readily recognize other approaches for generating a pre-tune signal for the dual YTO 106. All such approaches to generating a pre-tune signal are within the scope of this invention.

Figure 6:
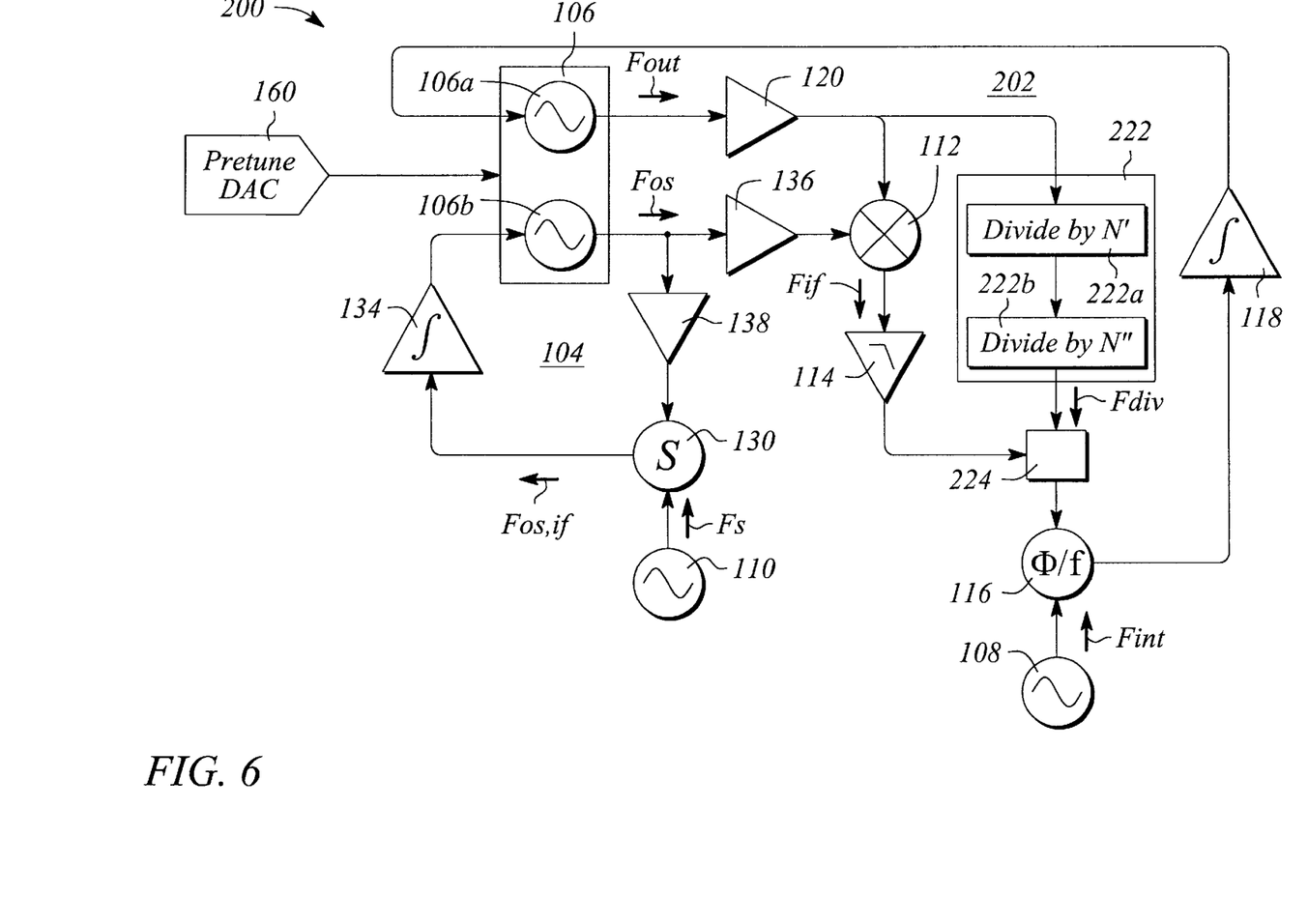
FIG. 6 illustrates a block diagram of another embodiment of the dual YTO microwave synthesizer in FIG. 5 having a novel dual operational mode main loop.

In another aspect of the present invention, a microwave synthesizer 200 having a mode selection feature in the main loop 202 is provided. The mode selection feature selects between operating the main loop 202 in an offset or dual loop mode and a fast tuning, wide tuning range, variable divider or a single loop mode. The microwave synthesizer 200 comprises a main loop 202 and an offset loop 104. The main loop 202 comprises the elements described above for the main loop 102, and further comprises a frequency divider 222 that has an input connected to the output of the optional amplifier 120 and a mode selection switch 224 positioned between the main loop filter 114, frequency divider 222 and the main loop PFD 116. FIG. 6 illustrates a block diagram of the dual YTO microwave synthesizer 200 having the mode selection feature of the present invention incorporating the divider 222 and mode selection switch 224 in the main loop 202. A first input port of the mode selection switch 224 is connected to the output of the filter 114, a second input port of the mode selection switch 124 is connected to the output of the frequency divider 222. An output port of the mode selection switch 124 is connected to the first input of the PFD 116.

In addition to being applied to the main loop mixer 112 to produce the signal Fif, the signal Fout also is applied to the input of the main loop frequency divider 222. The main loop divider 222 frequency divides the signal Fout producing a divided signal Fdiv. The signal Fdiv has a frequency fout/N where N is the division factor of the main loop divider 222 and fout is the frequency of the signal Fout. The mode selection switch 224 selects between the signal Fif and the signal Fdiv. When the mode selection switch 224 selects for the signal Fif, the main loop 202 functions as a low phase noise offset PLL. Alternatively, when the mode selection switch 224 selects for the signal Fdiv, the main loop 202 operates as a single loop PLL. Hence the mode selection switch 124 determines whether the microwave synthesizer 200 operates in an offset mode or a faster tuning, wide tuning span, single loop mode, respectively.

Preferably, the main loop divider 222 comprises a first main loop divider 222a and a second main loop divider 222b. The first divider 222a preferably is implemented in a high frequency technology, as the first divider 222a must accept input signals in the range of the frequency of the signal Fout. The second divider 222b can be implemented in a technology having a lower operating frequency range since the second divider 222b accepts signals that have already been frequency divided by the first divider 222a. More preferably, the first divider 222a is implemented using Heterojunction Bipolar Transistor (HBT) technology while the second divider 222b can be implemented using a somewhat slower and lower cost technology such as emitter-coupled logic (ECL).

Additionally, the first divider 222a generally provides a smaller portion of the overall division factor N than the second divider 222b. In other words, if N' is the division factor of the first divider 222a and N" is the division factor of the second divider 222b, then the relationship between N, N' and N" is given by $$N' < N'' \text{ and } N'* N'' = N \qquad (5)$$

Figure 7:
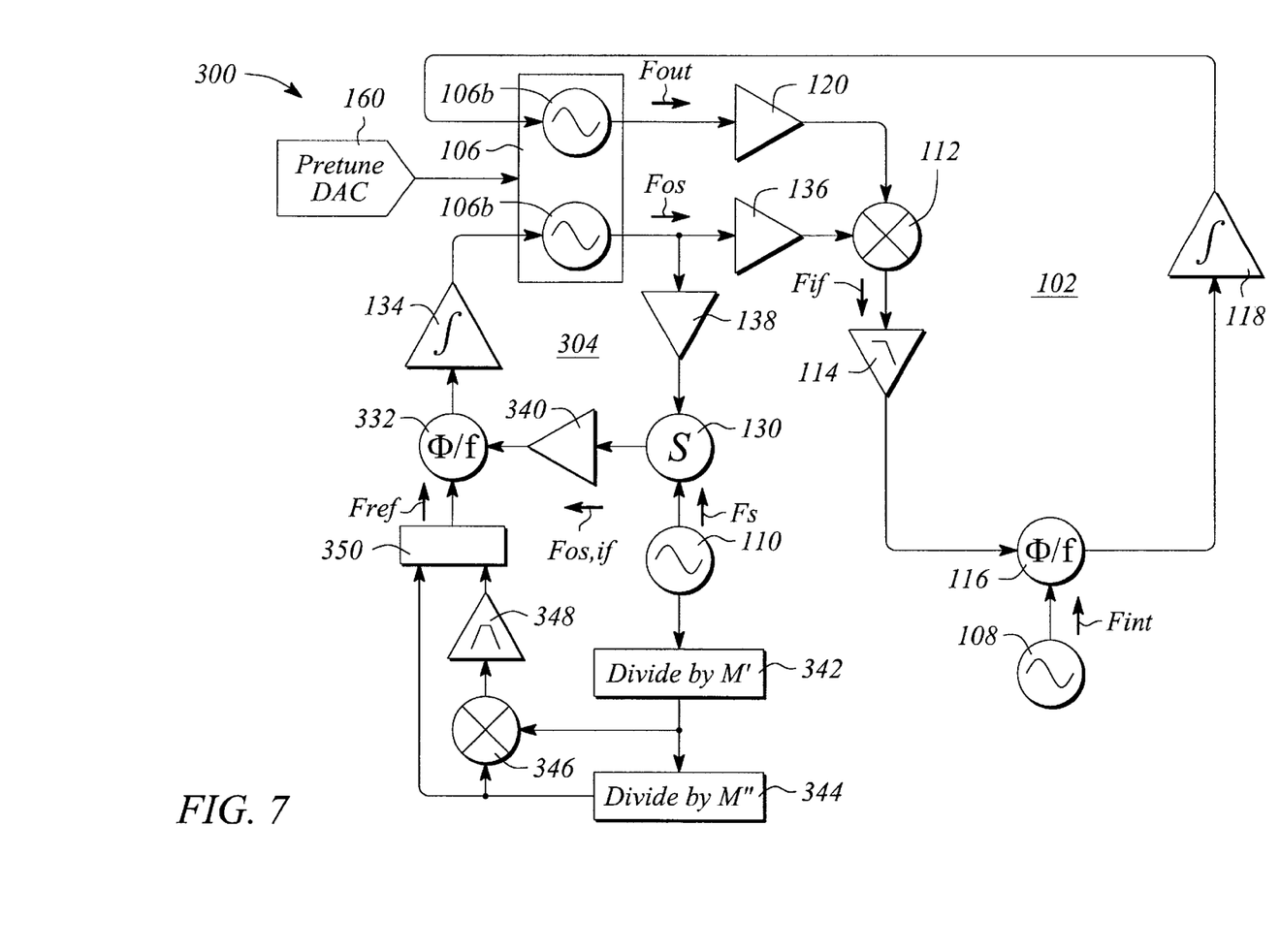
FIG. 7 illustrates a block diagram of another embodiment of the dual YTO microwave synthesizer in FIG. 5 having a novel offset loop for reduced frequency step size of the high frequency offset signal Fos.

In yet another aspect of the present invention, a microwave synthesizer 300 having an offset signal with a smaller step size is provided and illustrated in FIG. 7. The smaller step size of the offset signal Fos of microwave synthesizer 300 of the present invention facilitates the use of a reduced tuning range interpolation signal Fint in the main loop. The microwave synthesizer 300 comprises the main loop 102, as described above for the microwave synthesizer 100, and an offset loop 304 wherein the offset loop 304 comprises the elements of the offset loop 104 and further comprises an offset loop phase/frequency detector (PFD) 332, a second offset loop amplifier 340, a first offset loop divider 342, a second offset loop divider 344, an offset loop mixer 346, a band pass filter (BPF) 348, and a signal selection switch 350. An input port of the second offset loop amplifier 340 is connected to the output port of the sampler 130. An output port is connected to a first input port of the PFD 332. An output of the PFD 332 is connected to the input port of the offset loop integrator 134. In this embodiment of the microwave synthesizer 300, the offset loop sampler 130 acts strictly as a downconverter and the PFD 332 provides the phase and frequency detection for the offset loop 304.

Furthermore, a second output port of the reference oscillator 110 is connected to an input port of the first offset loop divider 342. An output port of the first divider 342 is connected to an input port of the second offset loop divider 344 and to an input of the offset loop mixer 346. An output of the second divider 344 is connected to a second input port of the mixer 346 and to a first input port of the signal selection switch 350. An output of the mixer 346 is connected to an input port of the BPF 348. An output port of the BPF 348 is connected to a second input port of the signal selection switch 350. An output of the signal selection switch 350 is connected to a second input of the PFD 332. The signal selection switch 350, the mixer 346, BPF 348, first offset loop divider 342, and second offset loop divider 344 function in combination as a selectable frequency divider.

In the microwave synthesizer 300, a reference signal Fref from the selection switch 350 is a variable or selectable signal generated by the selectable frequency divider and is based on either an output signal from the second offset loop divider 344 or an output signal of the BPF 348. The signal selection switch 350 determines which of these two output signals is applied to and used by the PFD 332 as the reference signal Fref. The output signal from the first offset loop divider 342 is applied to the second offset loop divider 344 and to the offset loop mixer 346. The mixer 346 mixes the output signal from the first divider 342 with an output of the second divider 344 to produce an input signal for the BPF 348. The implementation of the offset loop 304 in FIG. 7 is one implementation to generate a selectable or variable signal Fref used to phase lock the offset loop 304. One skilled in the art would readily recognize other appropriate reference signals Fref and the means for generating the same. All such reference signals and means for generating them are within the scope of the present invention.

In the synthesizer 300 of FIG. 7, instead of using the offset loop sampler 130 as a phase detector to produce the signal Fos,if at DC, as described hereinabove for the microwave synthesizer 100 of FIG. 5, a selectable signal Fos,if is used. The selectable signal Fos,if produced by the sampler 130 has a frequency that is determined by Fs and Fos and is phase locked to the selectable reference signal Fref. The reference signal Fref is selected, in part, by the signal selection switch 350. The locking of Fos,if to Fref produces an error signal that is applied to the integrator 134 as described hereinabove.

For example, if it assumed that the reference signal Fref is chosen to be at 12.5 MHz or 37.5 MHz. The 12.5 MHz and 37.5 MHz reference signals can, in turn, be derived from a signal Fs with a frequency fs=100 MHz. In particular, the frequency 12.5 MHz is derived from the frequency fs by dividing the frequency fs by M=M'*M''=8. Dividing the frequency fs of the signal Fs by M=8 is accomplished by the first offset loop divider 342 having a division factor of M'=4 (i.e., 100 MHz/4=25 MHz) and the second offset loop divider 344 having a division factor of M''=2 (i.e., 25 MHz/2=12.5 MHz). Similarly, the 37.5 MHz reference signal Fref is obtained by mixing the 12.5 MHz reference signal Fref with the frequency 25 MHz, which is derived from the 100 MHz signal Fs divided by M'=4 in the first divider 342. Moreover, by using both upper and lower mixing products from the sampler 130, the resulting offset signal Fos can be locked to either H*fs+/-12.5 MHz or H*fs+/-37.5 MHz. Therefore a step size of 25 MHz using a sampling frequency fs=100 MHz can be achieved.

Also, since the input frequency of the dividers 342, 344 and mixer 346 is below 100 MHz, the dividers 343, 344 and mixer 346 can be implemented with relatively inexpensive CMOS based devices. Such CMOS devices typically have a phase noise floor of below −150 dBc/Hz. Further, advantageously, the microwave synthesizer 300 reduces the step size for the offset signal Fos, as mentioned above, and as such does not degrade the phase noise of the offset signal Fos. The 25 MHz frequency step size of the offset signal Fos allows a frequency range of the IF signal Fif to be from 10 MHz to 27.5 MHz with an overlap frequency range fo=5 MHz. Compared to the case of the IF signal Fif in the main loop 102, 202 having the frequency range of 45 MHz to 105 MHz, the same interpolation signal Fint can be divided by 4 to achieve about 12 dB lower phase noise and spurious performance. When the interpolation source 108 is implemented with a fractional-N PLL or DDS, as described above, but with a frequency range divided by 4, the fractional-N PLL can achieve lower than −135 dBc/Hz of phase noise and the DDS can likely reduce spurs to below −75 dBc.

With the signal Fos and the interpolation signal Fint both potentially achieving −135 dBc/Hz of phase noise performance, advantageously the combined phase noise pedestal of the signal Fout can be as good as −132 dBc/Hz. The present invention advantageously provides state-of-the-art-type phase noise performance. If a DDS is used and its worst spurs cannot be avoided, the spurious performance still likely can be better than −75 dBc. There will be no crossing spurs in the offset signal Fos and only very high order crossing spurs in the signal Fout. While a low phase noise, fixed frequency VCXO is needed for the synthesizers 200, 300, the wide tuning range of the signal Fs with its ECL components is not needed, thereby controlling cost. The major added cost for the present invention compared to the traditional approach is the second YTO needed to produce the signal Fos. The YTO is an expensive component and it consumes significant power due to its main coil requirement. However, the microwave synthesizers 100, 200, 300 of the present invention provides a dual YTO 106 wherein the main YTO 106a and the offset YTO 106b share the main coil to minimize any increase in power consumption.

Moreover, the signal Fos is offset in frequency from the signal Fout by the frequency of the signal Fif and the signal Fif is no larger than about 40 MHz. Therefore, it is preferable for the present invention to combine the two YTOs 106a and 106b in the same package, with both oscillators sharing the same main coil and being independently fine-tuned by their respective individual FM coils. The sensitivity of a typical FM coil can tune the oscillators several hundred MHz and thus, slight difference in the current into these two FM coils will result in the required Fif offset. In addition, since a single main coil is shared between the two YTOs 106a, 106b, advantageously no significant increase in power is required. As an example of a typical YTO having a main coil sensitivity of 50 mA/GHz, 350 mA of current is needed to tune the YTO to 7 GHz. The main coil thus consumes over 5 watts of power if the current is drawn from a 15-volt supply. Sharing the same main coil in this case should add no more than 0.5 watt to the power consumption due to the second YTO.

Furthermore, since the major cost of the dual YTO 106 is in its packaging, adding the second oscillator to the same package would incur perhaps less than a 30% added cost to the single YTO. The two oscillators should be well isolated to avoid the signal Fos leaking into the signal Fout and consequently showing up as a single sideband spur in the output signal. One skilled in the art would readily understand the need for such isolation and would, without undue experimentation, be able to construct such a dual YTO 106 with sufficient isolation.

Figure 8:
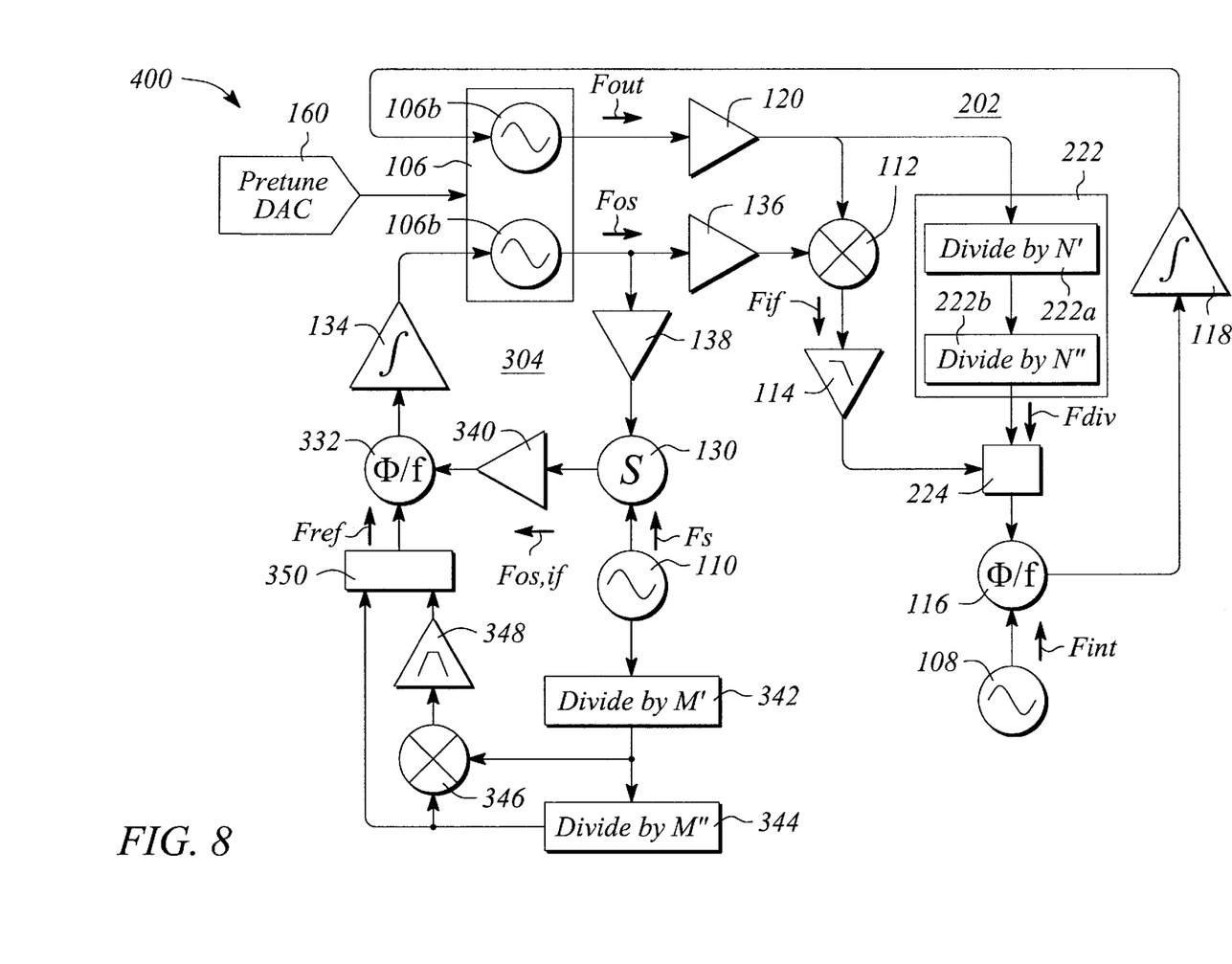
FIG. 8 illustrates a block diagram of yet another embodiment of the dual YTO microwave synthesizer in FIG. 5 combining the features and advantages of the dual YTO synthesizers of FIGS. 6 and 7.

FIG. 8 illustrates a block diagram of yet another embodiment of the dual YTO microwave synthesizer 400. The dual YTO microwave synthesizer 400 combines the features and advantages of the dual YTO synthesizers 200, 300 of FIGS. 6 and 7.

The dual YTO microwave synthesizer 100, 200, 300, 400 of the present invention achieves significant improvements in phase noise without large increases in cost or power consumption compared to the conventional offset loop PLL synthesizer. In addition, the dual YTO microwave synthesizer 200, 400 incorporate switchable paths that allows the offset path to be bypassed. The selection of a bypass mode using the mode selection switch 224 disables the path that carries the signal Fif and instead routes a signal from the main loop divider 222 to the main loop PFD 116. In this mode, very wide continuous swept spans are possible albeit at the expense of much worse phase noise performance.

For example, using a HBT based first divider 222a with a division factor of 8 and followed by an ECL based second divider 222b with a division factor of 32 provide a main loop divider 222 with a total division factor of N=256. This, in turn, enables the output signal Fout to be swept across a range of frequencies from 3000 to 7000 MHz when the interpolation signal Fint is swept from 11.7 MHz to 27.34 MHz. The phase noise floor of the ECL divider 222b at this output frequency range is likely to be about −145 dBc/Hz, resulting in a signal Fout phase noise pedestal of about −97 dBc/Hz in this mode due to the 48 dB noise gain of N being 256.

Thus there has been described a novel dual YTO microwave synthesizer 100, 200, 300, 400. It should be understood that the above-described embodiments are merely illustrative of the some of the many specific embodiments that represent the principles of the present invention. Clearly, those skilled in the art can readily devise numerous other arrangements without departing from the scope of the present invention.

What is claimed is:

1. A microwave synthesizer for generating a tunable output signal comprising:
    a main signal loop comprising a main YIG-tuned Oscillator (YTO) that produces an output signal Fout at a main YTO output; and
    an offset signal loop comprising an offset YTO that produces an output signal Fos at an offset YTO output, the signal Fos being mixed with the signal Fout in the main loop to control the frequency of the signal Fout,
    wherein the main YTO and the offset YTO share a main coil.

2. The microwave synthesizer of claim 1, wherein the main signal loop further comprises mode selection that selects between single loop operation in the main loop only and dual loop operation in both the main loop and the offset loop.

3. The microwave synthesizer of claim 1, wherein the offset signal loop further comprises a selectable frequency divider that provides a smaller step size for the output signal Fos, such that an interpolation signal Fint having reduced tuning range can be used in the main signal loop.

4. The microwave synthesizer of claim 1, wherein the main signal loop further comprises mode selection that selects between single loop operation in the main loop only and dual loop operation in both the main loop and the offset loop, and
    wherein the offset signal loop further comprises a selectable frequency divider that provides a smaller step size for the output signal Fos, such that an interpolation signal Fint having reduced tuning range can be used in the main signal loop.

5. The microwave synthesizer of claim 1 wherein the main loop YTO and the offset loop YTO have a common housing.

6. The microwave synthesizer of claim 1, wherein the main loop YTO and the offset loop YTO each has a separate FM coil.

7. The microwave synthesizer of claim 1, wherein the main signal loop further comprises:
    a main loop mixer that receives the signal Fout at a first main mixer input and the signal Fos at a second main mixer input and multiplies the signal Fout with the signal Fos to produce an IF signal Fif at a main mixer output;
    a main loop filter that receives and filters the signal Fif,
    a main loop phase/frequency detector (PFD) receiving the filtered IF signal Fif at a first main PFD input;
    a main loop interpolation signal source producing an interpolation signal Fint that is applied to a second main PFD input, wherein the main loop PFD compares the filtered signal Fif to the interpolation signal Fint and produces a main loop error signal at a main PFD output; and
    a main loop integrator that receives the main loop error signal at a first main integrator input and integrates the main loop error signal to produce a main loop control voltage that is applied to a main YTO input controlling the frequency of the output signal Fout produced by the main YTO.

8. The microwave synthesizer of claim 7, wherein the main signal loop further comprises a main loop amplifier between the main YTO and the main loop mixer that amplifies the signal Fout before being mixed.

9. The microwave synthesizer of claim 7, wherein the offset signal loop further comprises:
    a sampler that receives the signal Fos at a first sampler input;
    a sample signal source that produces a sample signal Fs and applies the sample signal Fs to a second sampler input, wherein the sampler produces a sampled offset signal Fos, if at a sampler output at a frequency determined by the sample signal Fs and the signal Fos;
    an offset loop integrator that produce an offset control voltage that is applied to an offset YTO input controlling the frequency of the offset signal Fos produced by the offset YTO.

10. The microwave synthesizer of claim 9, wherein the offset signal loop further comprises a selectable frequency divider that provides a smaller step size for the output signal Fos, such that the interpolation signal Fint having reduced tuning range can be used in the main signal loop.

11. The microwave synthesizer of claim 10, wherein the selectable frequency divider comprises:
    an offset loop phase/frequency detector (PFD) that receives the sampled offset signal Fos,if at a first offset PFD input;
    a first offset loop divider that receives the signal Fs from the sample signal source and first divides the signal Fs by M';
    a second offset loop divider that receives the first divided Fs signal and divides the first divided Fs signal by M" to produce a second divided Fs signal;
    an offset loop mixer that receives the first divided Fs signal at a first offset mixer input and receives the second divided Fs signal at a second offset mixer input, the offset loop mixer multiplies the first divided Fs signal and the second divided Fs signal;
    a band pass filter that receives the multiplied Fs signal from the offset loop mixer at a band pass filter input and filters the multiplied Fs signal; and
    a signal selection switch that receives the filtered and multiplied Fs signal at a first selection input, receives the second divided Fs signal at a second selection input and selects a reference signal Fref from either the filtered and multiplied Fs signal or the second divided Fs signal to be applied to a second offset PFD input,
    wherein the offset loop PFD phase locks the signal Fos,if to the selected reference signal Fref and produces an offset loop error signal that is applied to an offset integrator input of the offset loop integrator.

12. The microwave synthesizer of claim 7, wherein the main signal loop further comprises mode selection that selects between single loop operation in the main loop only and dual loop operation in both the main loop and the offset loop by choosing either the IF signal Fif or a frequency divided Fout signal Fdiv to apply to the first main PFD input of the main loop PFD.

13. The microwave synthesizer of claim 12, wherein the mode selection comprises:
a mode selection switch having a first switch input accepting the IF signal Fif and having a switch output connected to the first main PFD input of the main loop PFD; and
a main loop divider that receives the signal Fout at a first main divider input and frequency divides the signal Fout by N to produce the frequency divided signal Fdiv at a main divider output that is applied to a second switch input of the mode selection switch.

14. The microwave synthesizer of claim 13, wherein N equals N' times N", and the main loop divider comprises:
a first divisor that divides the signal Fout by N'; and
a second divisor that divides the divided signal Fout by N" to produce the signal Fdiv at the main divider output.

15. The microwave synthesizer of claim 12, wherein the offset signal loop further comprises:
a sampler that receives the signal Fos at a first sampler input;
a sample signal source that produces a sample signal Fs and applies the sample signal Fs to a second sampler input, wherein the sampler produces a sampled offset signal Fos, if at a sampler output at a frequency determined by the sample signal Fs and the signal Fos;
an offset loop integrator that produce an offset control voltage that is applied to an offset YTO input controlling the frequency of the offset signal Fos produced by the offset YTO.

16. The microwave synthesizer of claim 15, wherein the offset signal loop further comprises a selectable frequency divider that provides a smaller step size for the output signal Fos, such that the interpolation signal Fint having reduced tuning range can be used in the main signal loop.

17. The microwave synthesizer of claim 16, wherein the selectable frequency divider comprises:
an offset loop phase/frequency detector (PFD) that receives the sampled offset signal Fos,if at a first offset PFD input;
a first offset loop divider that receives the signal Fs from the sample signal source and first divides the signal Fs by M';
a second offset loop divider that receives the first divided Fs signal and divides the first divided Fs signal by M" to produce a second divided Fs signal;
an offset loop mixer that receives the first divided Fs signal at a first offset mixer input and receives the second divided Fs signal at a second offset mixer input, the offset loop mixer multiplies the first divided Fs signal and the second divided Fs signal;
a band pass filter that receives the multiplied Fs signal from the offset loop mixer at a band pass filter input and filters the multiplied Fs signal; and
a signal selection switch that receives the filtered Fs signal at a first selection input, receives the second divided Fs signal at a second selection input and selects a reference signal Fref from either the filtered Fs signal or the second divided Fs signal to be applied to a second offset PFD input,
wherein the offset loop PFD phase locks the signal Fos,if to the selected reference signal Fref and produces an offset loop error signal that is applied to an offset integrator input of the offset loop integrator.

18. The microwave synthesizer of claim 1, wherein the offset signal loop further comprises:
a sampler that receives the signal Fos at a first sampler input;
a sample signal source that produces a sample signal Fs and applies the sample signal Fs to a second sampler input, wherein the sampler produces a sampled offset signal Fos,if at a sampler output at a frequency determined by the sample signal Fs and the signal Fos;
an offset loop integrator that produces an offset control voltage that is applied to an offset YTO input controlling the frequency of the offset signal Fos produced by the offset YTO.

19. The microwave synthesizer of claim 18, wherein the offset loop integrator integrates the sampled offset signal Fos,if to produce the offset control voltage.

20. The microwave synthesizer of claim 18, wherein the sampled offset signal Fos,if that is applied to an offset integrator input has a frequency equal to zero.

21. The microwave synthesizer of claim 18, wherein the offset signal loop further comprises an offset sampler amplifier between the sampler and the offset YTO that amplifies the signal Fos.

22. The microwave synthesizer of claim 18, wherein the offset signal loop further comprises an offset amplifier that amplifies the signal Fos from the offset YTO before being mixed with the signal Fout in the main signal loop.

23. The microwave synthesizer of claim 18, wherein the offset signal loop further comprises a selectable frequency divider that provides a smaller step size for the output signal Fos, such that an interpolation signal Fint having reduced tuning range can be used in the main signal loop.

24. The microwave synthesizer of claim 23, wherein the selectable frequency divider comprises:
an offset loop phase/frequency detector (PFD) that receives the sampled offset signal Fos,if at a first offset PFD input;
a first offset loop divider that receives the signal Fs from the sample signal source and first divides the signal Fs by M';
a second offset loop divider that receives the first divided Fs signal and divides the first divided Fs signal by M" to produce a second divided Fs signal;
an offset loop mixer that receives the first divided Fs signal at a first offset mixer input and receives the second divided Fs signal at a second offset mixer input, the offset loop mixer multiplies the first divided Fs signal and the second divided Fs signal;
a band pass filter that receives the multiplied Fs signal from the offset loop mixer at a band pass filter input and filters the multiplied Fs signal; and
a signal selection switch that receives the filtered Fs signal at a first selection input, receives the second divided Fs signal at a second selection input and selects a reference signal Fref from either the filtered Fs signal or the second divided Fs signal to be applied to a second offset PFD input,
wherein the offset loop PFD phase locks the signal Fos,if to the selected reference signal Fref and produces an offset loop error signal that is applied to an offset integrator input of the offset loop integrator.

25. The microwave synthesizer of claim 24, wherein the offset signal loop further comprises an offset detector amplifier between the sampler output of the sampler and the first offset PFD input of the offset loop PFD that amplifies the signal Fos,if.

26. The microwave synthesizer of claim 25, wherein the sampler samples the signal Fos received at the first sampler input at a rate determined by the sample signal Fs to produce the sampled offset signal Fos,if that is applied to an input of the offset detector amplifier.

* * * * *